(12) United States Patent
Jung

(10) Patent No.: US 7,242,612 B2
(45) Date of Patent: Jul. 10, 2007

(54) NON-VOLATILE MEMORY DEVICES AND METHODS FOR DRIVING THE SAME

(75) Inventor: Jin Hyo Jung, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 207 days.

(21) Appl. No.: 11/148,532

(22) Filed: Jun. 9, 2005

(65) Prior Publication Data

US 2006/0035433 A1    Feb. 16, 2006

(30) Foreign Application Priority Data

Jun. 9, 2004    (KR)    ...................... 10-2004-0042120

(51) Int. Cl.
*G11C 16/04*    (2006.01)

(52) U.S. Cl. ........................... 365/185.03; 365/185.01; 257/316

(58) Field of Classification Search ............ 365/185.03
See application file for complete search history.

(56) References Cited

U.S. PATENT DOCUMENTS

| | | | |
|---|---|---|---|
| 5,877,523 A * | 3/1999 | Liang et al. ................. 257/315 |
| 6,323,088 B1 * | 11/2001 | Gonzalez et al. ........... 438/257 |
| 6,462,375 B1 * | 10/2002 | Wu .............................. 257/316 |
| 6,673,677 B2 * | 1/2004 | Hofmann et al. ........... 438/257 |
| 6,720,614 B2 * | 4/2004 | Lin et al. ..................... 257/316 |
| 6,835,621 B2 * | 12/2004 | Yoo et al. .................... 438/261 |
| 6,963,508 B1 * | 11/2005 | Shone .................... 365/185.28 |
| 7,005,349 B2 * | 2/2006 | Lee et al. ..................... 438/261 |
| 7,049,189 B2 * | 5/2006 | Chang et al. ................ 438/211 |
| 2003/0134475 A1 | 7/2003 | Hofmann et al. |

* cited by examiner

Primary Examiner—Son L. Mai
(74) Attorney, Agent, or Firm—Andrew D. Fortney

(57) ABSTRACT

Non-volatile memory devices and methods for driving the same are disclosed. An example non-volatile memory device includes a semiconductor substrate; source/drain junctions in a predetermined region of the semiconductor substrate; a main gate oxide layer above a surface of the semiconductor substrate and disposed between the source/drain junctions, a first end of the main gate oxide layer comprising a first bit charge storage unit including a first tunnel oxide layer, a first potential well layer, and a first coupling oxide layer, and a second, opposing end of the main gate oxide layer comprising a second bit charge storage unit including a second tunnel oxide layer, a second potential well layer, and a second coupling oxide layer; and a main gate electrode above the main gate oxide layer.

33 Claims, 9 Drawing Sheets

FIG. 6
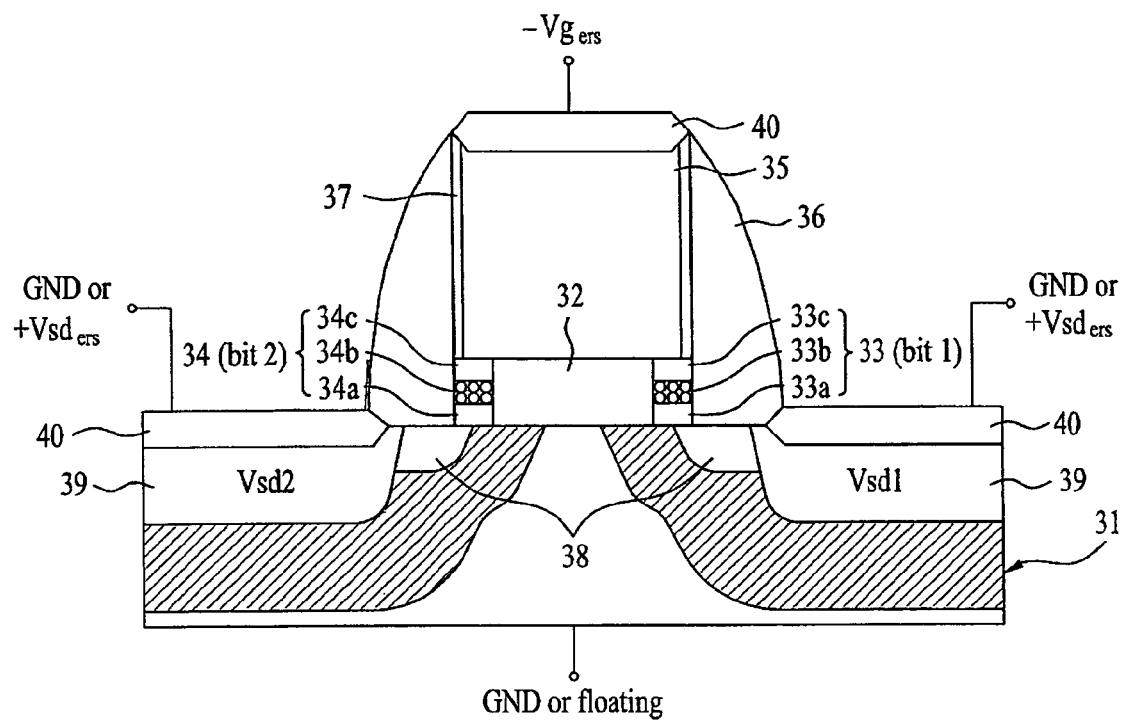
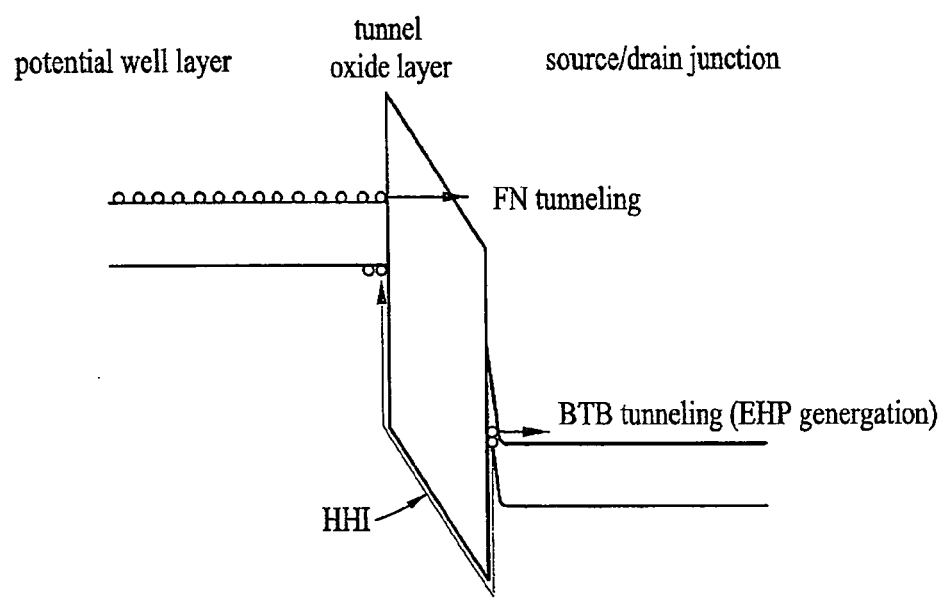

NON-VOLATILE MEMORY DEVICES AND METHODS FOR DRIVING THE SAME

FIELD OF THE DISCLOSURE

The present disclosure relates generally to memory devices and, more particularly, to non-volatile memory devices and methods for driving the same, which can perform a two-bit operation using only one transistor and can prevent the occurrence of an over-erasing problem without allocating additional area for a selection gate.

BACKGROUND

Non-volatile memory, in which there is no loss of stored data even in the event of a power supply interruption, is widely used for data storage in a variety of devices, including, for example, digital cameras and mobile phones. FIG. 1 illustrates a prior art single-transistor stacked cell structure for realizing a non-volatile memory device.

As shown in FIG. 1, a single-transistor stacked cell includes a semiconductor substrate 11; a tunnel oxide layer 12 selectively formed on a predetermined area of the semiconductor substrate 11; a stacked gate structure composed of a floating gate 13, an intergate insulating layer 14, and a control gate 15; an insulating layer spacer 16 disposed on either side of the stacked gate structure; an insulating layer 17 formed between the stacked gate structure and the insulating layer spacer 16; lightly doped drains 18a and 18b formed in the surface of the semiconductor substrate substantially under the insulating layer spacer 16; source/drain junctions 19a and 19b formed in the surface of the semiconductor substrate substantially beyond either side of the insulating layer spacer 16; and a silicide layer 20 formed on the source/drain junctions and on the control gate atop the stacked gate structure.

A single-transistor stacked cell constituted as described above enjoys a small footprint to facilitate device integration. In such a stacked cell, the floating gate 13 is fully enclosed by a dielectric layer and serves as the charge storage unit of the cell. In programming such a cell, hot-electron channel injection is applied to inject electrons into the floating gate 13 and to, thus, raise its threshold voltage (VT). In an erase operation electrons are removed from the floating gate 13 via Fowler-Nordheim (FN) tunneling to lower the threshold voltage (VT).

An over-erase state (i.e., VT≦0V) may occur due to a non-uniformity in semiconductor fabrication, (particularly, due to a non-uniformity in the thickness of the tunnel oxide layer 12), or due to stress being applied to the dielectric layer enclosing the floating gate 13. Here, it should be noted that none of the cells of a given bit line can be read if over erasing occurs in any one of the cells. Therefore, the prevention of over-erasing is a crucial operational requirement. Generally, in a single-transistor stacked cell such as that of FIG. 1, the problem of over-erasing is overcome by detecting over-erased cells and programming the detected cells after increasing their threshold voltages. This process, however, consumes excessive test time, requires a complicated circuit to compensate for the threshold voltages of the over-erased cells, and increases the complexity of the data-erasing process. Furthermore, to address the over-erasing problem, the single-transistor stacked cell is configured to prevent occurrence of the over-erasing state altogether, namely, by narrowing the range (window) of the allowable threshold voltage of the cell. In this regard, when performing the erasing operation in block units of more than several tens of kilobytes, a statistical threshold voltage distribution of an erased block is over-extended, thereby reducing an actual allowable threshold voltage range.

In the above-described non-volatile memory cell, a charge state of the floating gate (i.e., a threshold voltage) corresponds to a memory logic state. For an input voltage of 3.3V, the allowable threshold voltage range of the single-transistor stacked cell is about 1.0V~5.0V, and the cell current flowing in the single-transistor stacked cell is determined accordingly. For example, if a read voltage of 3.3V is applied to a control gate having a low-level threshold voltage set to 1.0V, the cell current corresponds to the difference (i.e., 3.3V–1.0V). On the other hand, when applying a read voltage of 3.3 V to a cell programmed at 5.0V, the current path in the channel of the cell is blocked. Thus, in a single-transistor stacked cell, when a read voltage is applied, either a current-flowing state or a current-blocking state is detected. These two current states correspond to two logic level states (i.e., a logic "1" and a logic "0"), thereby enabling the storage of one bit of digital data per cell.

In a data read operation, the data read speed of the memory is directly proportional to the cell current. That is, high cell current means high data read speed and vice versa. Therefore, since lower threshold voltages enable higher cell currents, a lower threshold voltage also means a higher read speed. Due to its low cell current, the above-described single-transistor stacked cell has difficulty in improving the data read speed.

Attempts to achieve a further reduced cell size (increased fineness) to meet the specification rule of the single-transistor stacked cell also have negative effects (e.g., poorer cell characteristics and lower cell reliability). For example, in the single-transistor stacked cell arranged in a memory array, a drain is directly connected to a bit line, and a source is connected to a common ground line. As such, when a drain voltage is applied, a drain turn-on or block-transistor punch-through phenomenon occurs and high leakage current is generated due to the drain's coupling to the floating gate. Therefore, a program current is increased, so that the number of charge pumping circuits must be increased. The drain turn-on, punchthrough, and high leakage current effects are amplified in inverse proportion to the width of the channel. Consequently, it is difficult to reduce the cell size. In addition, the memory array may unexpectedly inject hot electrons into non-selected cells contained in a selected bit line due to the leakage current. Further, the memory array may encounter a charge leakage problem in the non-selected cells due to electric field stress. In addition, a deterioration of a neighboring oxide layer of the floating gate of the storage transistor (cell) may occur when a contact and wiring process is performed with respect to the drain.

Even with the development of microfabrication technology, and although a flash memory cell may have a single-transistor structure, it is still difficult to reduce cell size due to the several problems described above. To solve these problems, the single-transistor stacked cell may include a selection gate transistor connected in series to the floating gate transistor. However, inclusion of such a selection gate transistor requires an allotment of an additional area during cell integration, which counteracts efforts to reduce cell size.

BRIEF DESCRIPTION OF THE DRAWINGS

FIG. 6 is a cross-sectional view of the example non-volatile memory device of FIG. 2 while being erased via an example driving method performed in accordance with the teachings of the present invention, shown together with a diagram of the erasing operation.

Wherever possible, like reference numbers are used throughout the drawings to refer to the same or similar parts.

DETAILED DESCRIPTION

Figure 1:
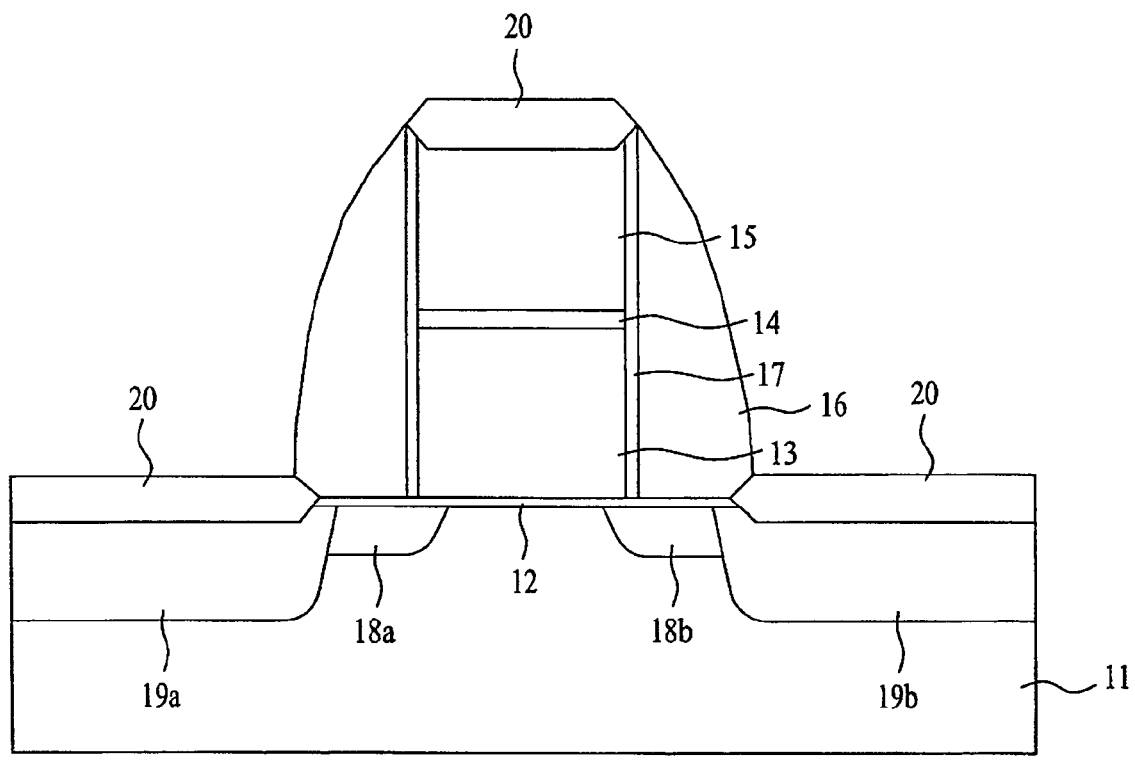
FIG. 1 is a cross-sectional view illustrating the structure of a conventional single-transistor stacked cell.
Figure 2:
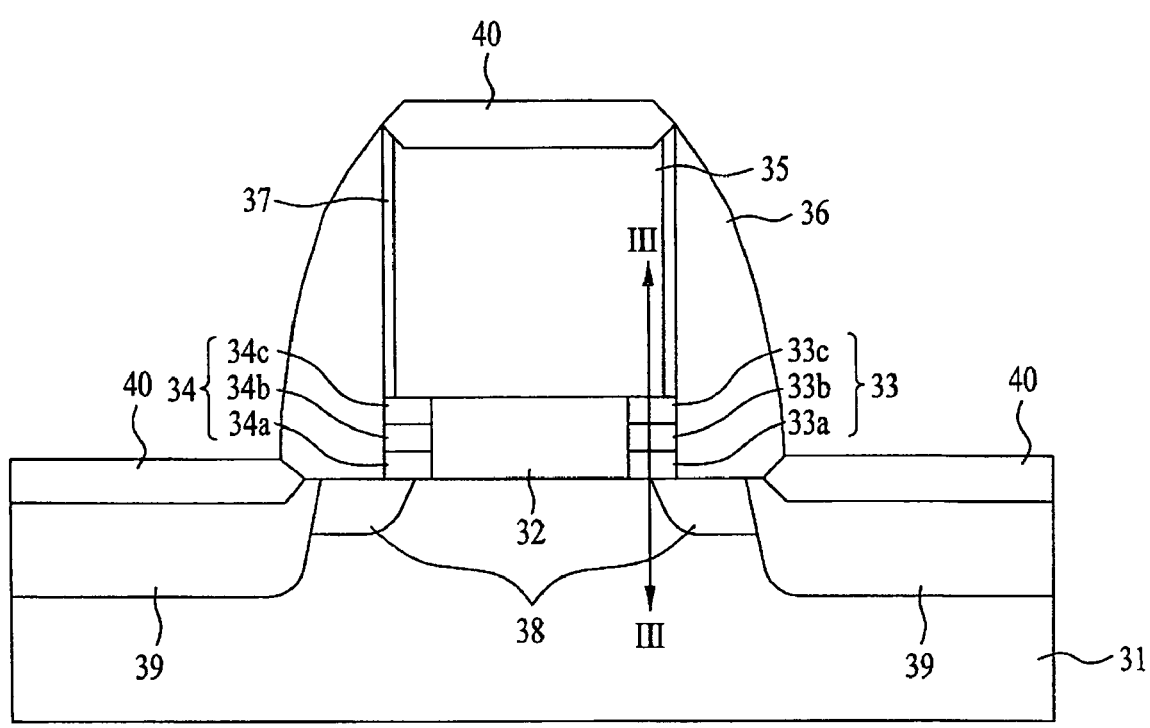
FIG. 2 is a cross-sectional view of an example non-volatile memory device constructed in accordance with the teachings of the present invention.

An example non-volatile memory device constructed in accordance with the teachings of the present invention is shown in FIG. 2. The example device of FIG. 2 is constituted as a single transistor (cell) divided into two sections. It, thus, provides a data storage capacity of two bits per cell. The example non-volatile memory device of FIG. 2 has a main gate electrode capable of performing both a control gate function and a selection gate function, thereby obviating the need for a selection gate.

As shown in FIG. 2, the example non-volatile memory device includes a semiconductor substrate 31 and lightly doped drain regions 38 formed in a predetermined surface region of the semiconductor substrate. It also includes source/drain junction regions 39 formed in predetermined surface regions of the semiconductor substrate as impurity diffusion layers to be disposed beyond and to have a greater depth than the lightly doped drain regions. Further, the example device of FIG. 2 includes a main gate oxide layer 32 formed on the semiconductor substrate 31 and substantially disposed between the lightly doped drain regions 38. The example device is also provided with first and second bit charge storage units 33 and 34 for storing first and second bits, respectively, disposed at either end of the main gate oxide layer 32. Moreover, the example device shown in FIG. 2 is provided with a main gate electrode 35 formed on the main gate oxide layer 32 and the first and second bit charge storage units 33, 34; a sidewall spacer 36 disposed at each side of the main gate electrode 35; a poly-oxide layer 37 formed between the main gate electrode 35 and the sidewall spacers 36; and a silicide layer 40 formed on the source/drain junction regions 39 and atop the main gate electrode 35. The first bit charge storage unit 33 of FIG. 2 includes a tunnel oxide layer 33a, a potential well layer 33b, and a coupling oxide layer 33c. The second bit charge storage unit 34 of FIG. 2 includes a tunnel oxide layer 34a, a potential well layer 34b, and a coupling oxide layer 34c. In the illustrated example, the tunnel oxide layers 33a and 34a are disposed at the bottom of the charge storage units adjacent the semiconductor substrate 31, and the coupling oxide layers 33c and 34c are disposed at the top of the charge storage units adjacent the main gate electrode 35.

The tunnel oxide layers 33a and 34a and the coupling oxide layers 33c and 34c are formed of a material having a large energy band gap. The potential well layers 33b and 34b are formed of a material having a smaller energy band gap than the tunnel oxide layers 33a and 34a and the coupling oxide layers 33c and 34c, such that a potential well is formed by each of the potential well layers. That is, each of the tunnel oxide layers 33a and 34a and the coupling oxide layers 33c and 34c has a higher energy band gap than the interceding potential well layers 33b and 34b. Each of the potential well layers 33b and 34b is formed of a material which exhibits a higher dielectric constant and lower trap density than either of its correspondingly adjacent layers, (i.e., the tunnel oxide layers and the coupling oxide layers). For example, the tunnel oxide layers 33a and 34a and the coupling oxide layers 33c and 34c may be formed of $SiO_2$, $Al_2O_3$, $Y_2O_3$, etc., and the potential oxide layers 33b and 34b may be formed of $HfO_2$, $ZrO_2$, $BaZrO_2$, $BaTiO_2$, $Ta_2O_5$, $ZrSiO_4$, a lanthanide-based oxide layer, a nitride layer, etc.

Figure 3:
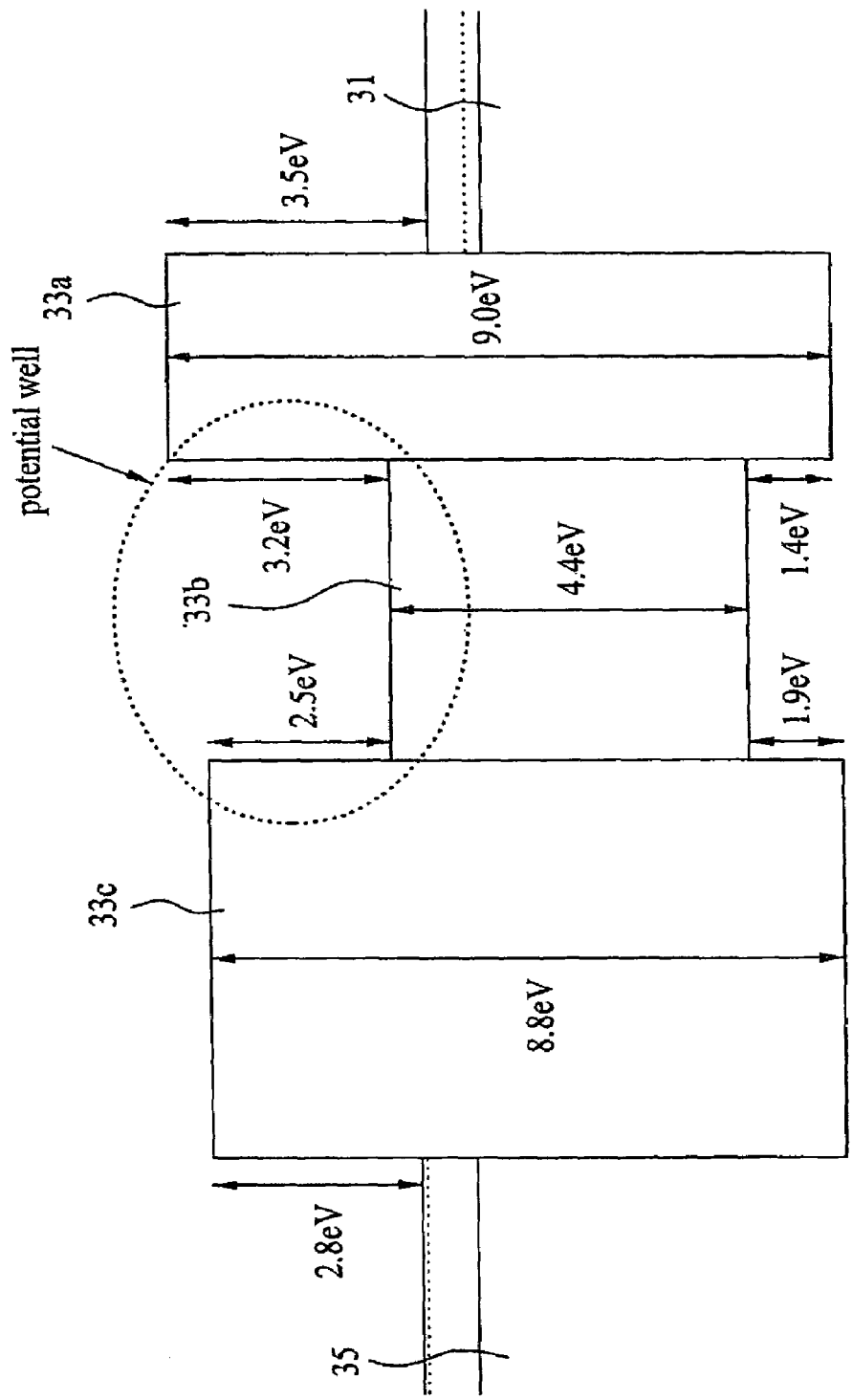
FIG. 3 is a diagram of an equilibrium-state energy band of an example non-volatile memory device constructed in accordance with the teachings of the present invention; the diagrammed energy band corresponds to line III—III of FIG. 2.

FIG. 3 diagrams an example equilibrium-state energy band structure to show the formation of a potential well in each of the potential well layers 33b and 34b respectively disposed between the tunnel oxide layers 33a and 34a and the coupling oxide layers 33c and 34c. In the illustrated example, the tunnel oxide layers 33a and 34a are formed of $SiO_2$, the potential well layers 33b and 34b are formed of $Ta_2O_5$, and the coupling oxide layers 33c and 34c are formed of $Al_2O_3$.

The electrical charge (potential) of a portion of the semiconductor substrate 31 situated directly below either of the potential well layers 33b and 34b may be changed as a result of channel hot-electron injection to inject electrons into one of the potential wells or as a result of Fowler-Nordheim tunneling whereby electrons are removed from the corresponding potential well. This change in potential produces one of two effects, namely, the presence or absence of a current flow in the semiconductor substrate according to the resulting potential of the corresponding portion of the semiconductor substrate 31. As a result, a non-volatile memory device of one bit can be implemented in each of the potential well layers 33b and 34b, such that storage for two bits can be implemented using only one transistor.

In an example method for driving the above-constructed non-volatile memory device, rather than fixing one electrode of the impurity diffusion layer (i.e., the source/drain junction region 39) as a source junction and the other electrode as a drain junction, either side of the impurity diffusion layer can be established as the source junction or as the drain junction, as desired, according to an input bias voltage. Thus, in an example driving method, the source/drain junction of the impurity diffusion layer may be denoted according to its correspondence to the bit charge storage units. Thus, the source/drain junction 39 adjacent the first bit charge storage unit 33 is denoted as the Vsd1 layer and the source/drain junction 39 adjacent the second bit charge storage unit 34 is denoted as the Vsd2 layer.

Figure 4:
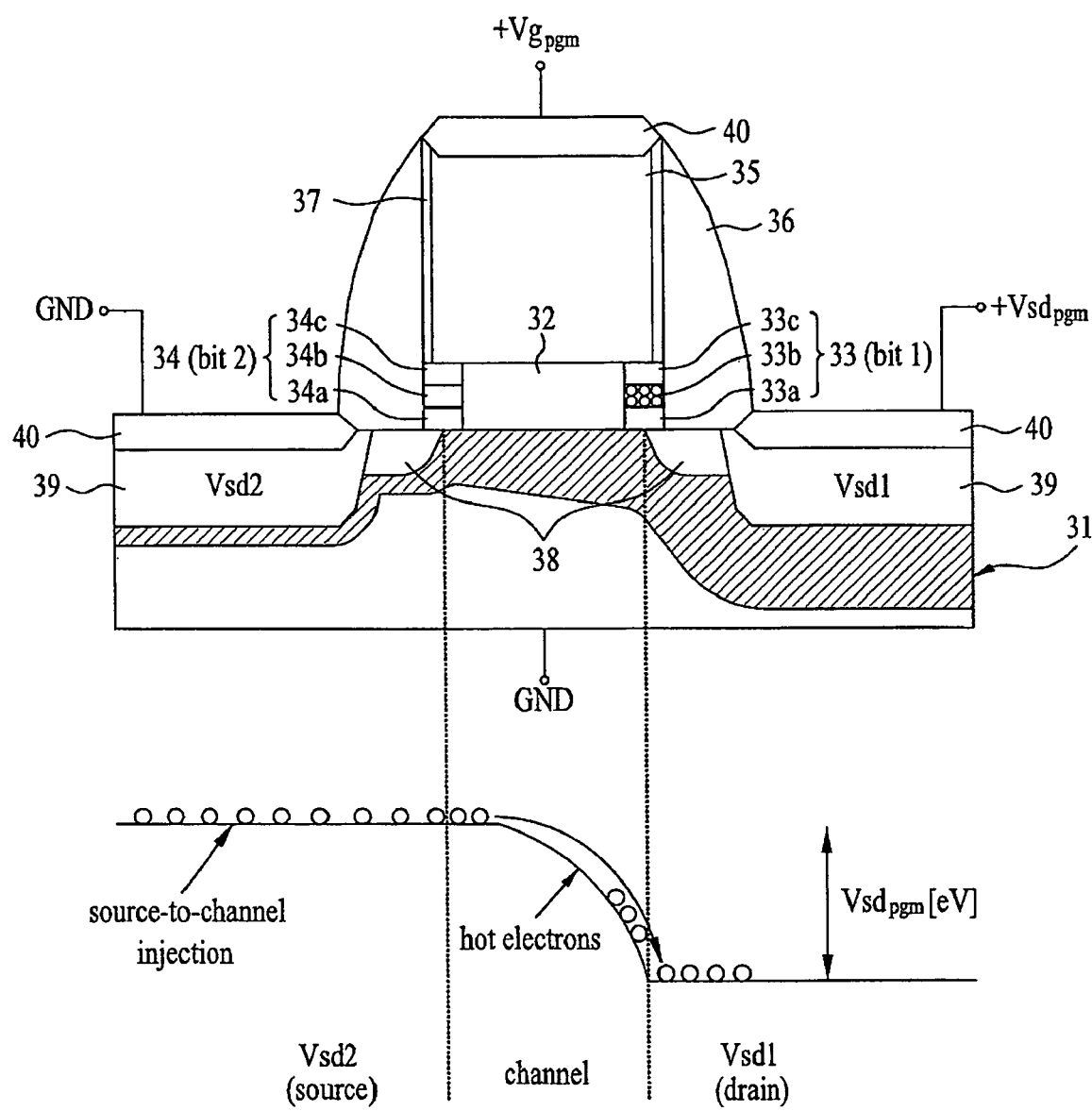
FIGS. 4 and 5 are cross-sectional views of the example non-volatile memory device of FIG. 2 during an example driving method of selective programming one of two bits of the cell performed in accordance with the teachings of the present invention, shown together with a diagram of the corresponding programming operation.
Figure 5:
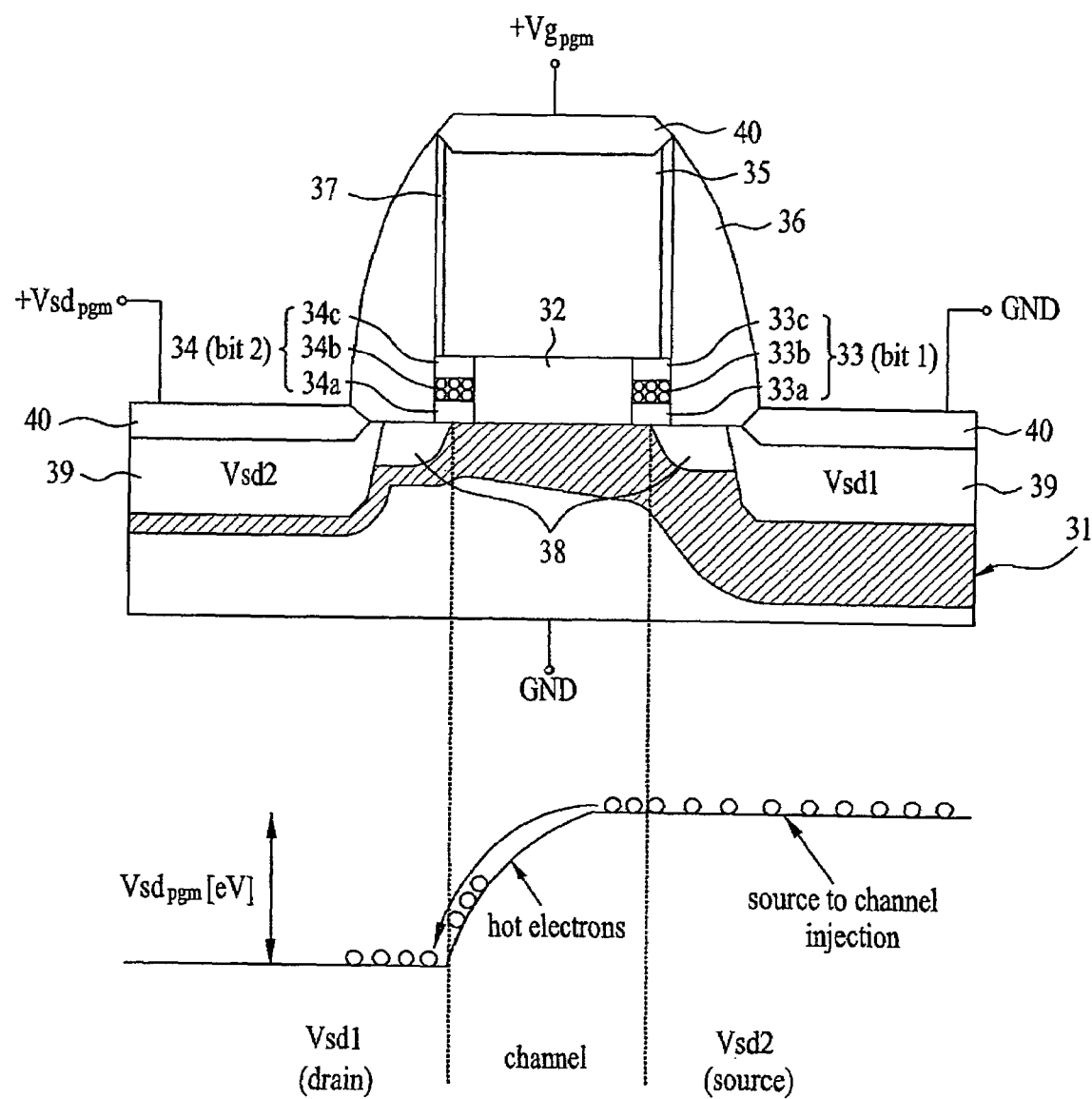
Figure 7:
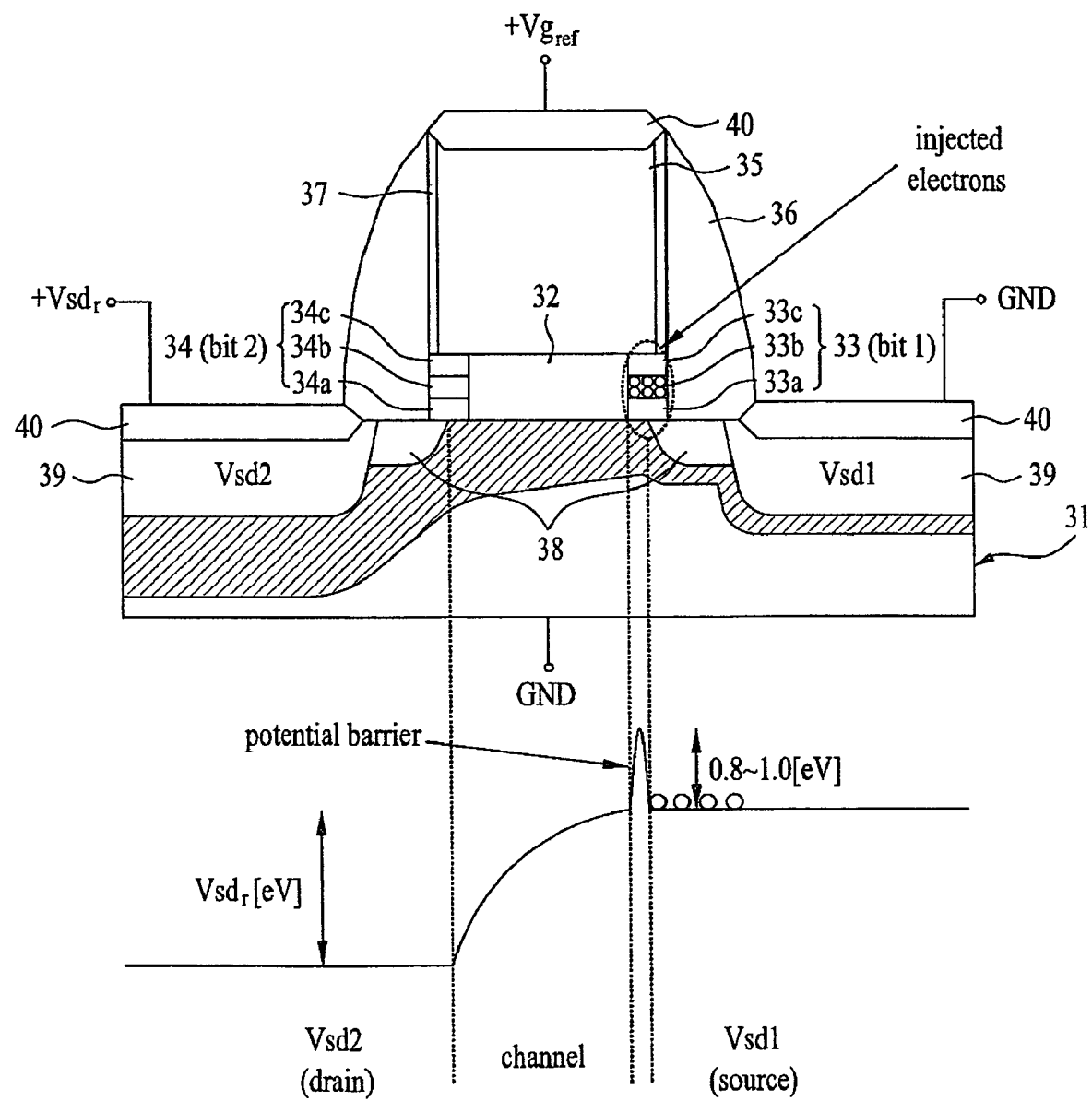
FIG. 7 is a cross-sectional view of the example non-volatile memory device of FIG. 2 in which the first of two bits of the cell in a programmed state is being read pursuant to an example driving method performed in accordance with the teachings of the present invention, shown together with a diagram of the read operation.
Figure 8:
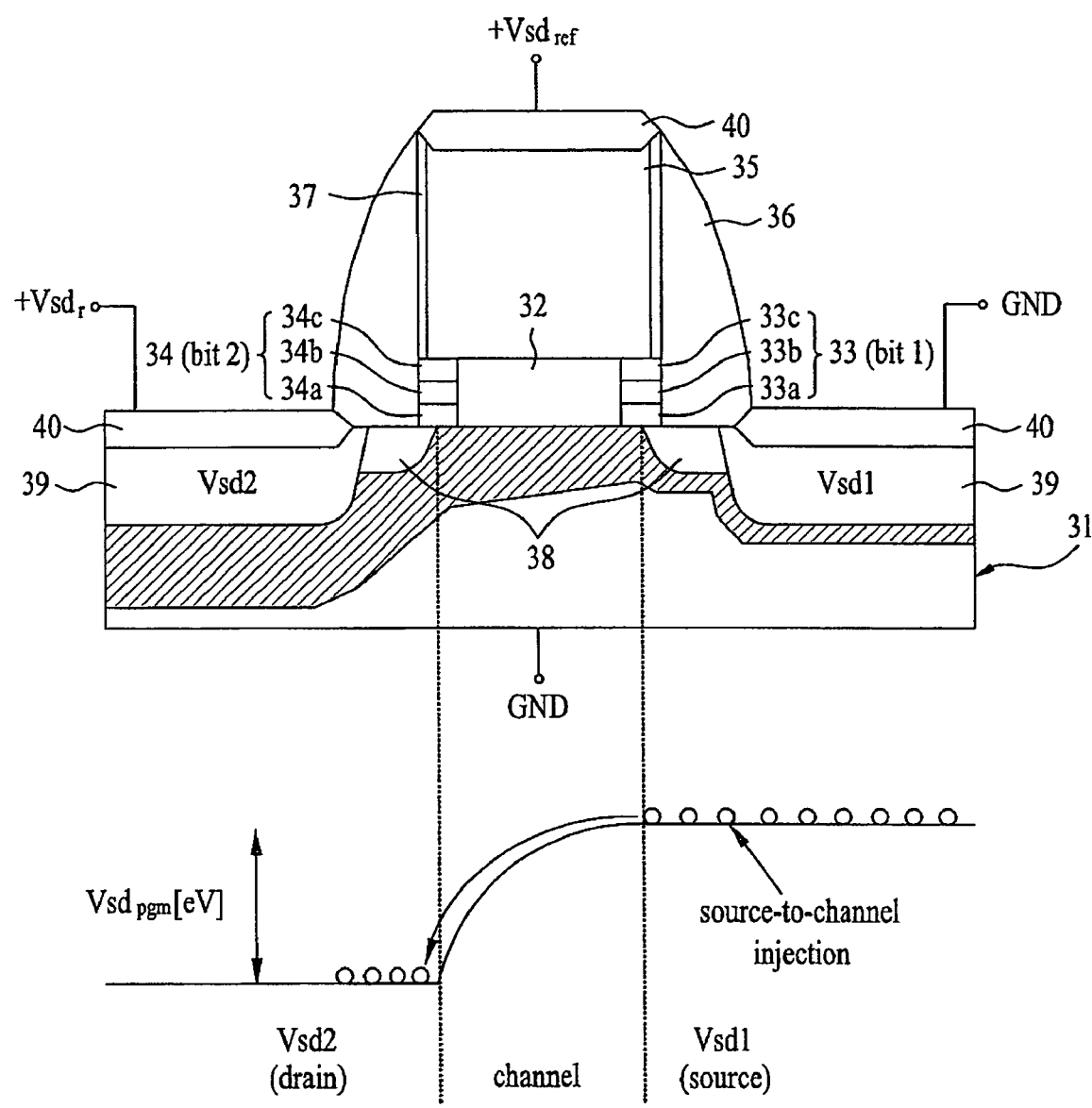
FIG. 8 is a cross-sectional view of the example non-volatile memory device of FIG. 2 in which the first of two bits of the cell in an erased state is being read pursuant to an example driving method performed in accordance with the teachings of the present invention, shown together with a diagram of the read operation.
Figure 9:
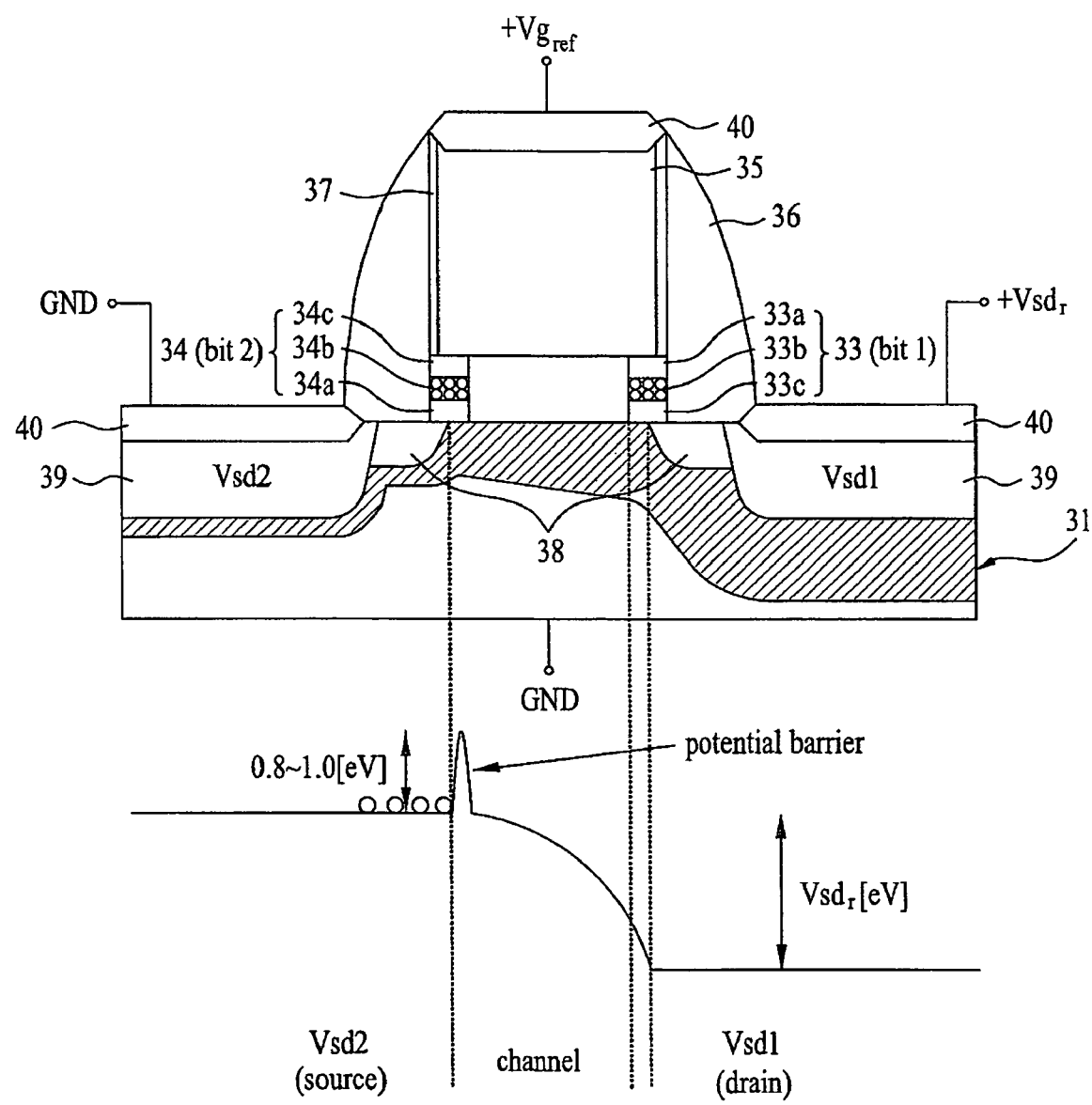
FIG. 9 is a cross-sectional view of the example non-volatile memory device of FIG. 2 in which the second of two bits of the cell is being read while both bits are programmed pursuant to an example driving method performed in accordance with the teachings of the present invention, shown together with a diagram of the read operation.

An example driving method includes programming, erasing, and reading operations for each of the first and second bit charge storage units 33 and 34, whereby a predetermined bias condition is correspondingly applied to an example non-volatile memory device. FIGS. 4 and 5 each illustrate an example bit-selective programming operation. FIG. 6 illustrates an example erasing operation using reverse biasing. FIGS. 7–9 illustrate various read operations.

Referring to FIGS. 4 and 5, (which respectively illustrate a selective programming of the first or second bit), a voltage +Vgpgm (i.e., a positive-potential predetermined gate voltage for programming) is applied to the main gate electrode 35 while the semiconductor substrate 31 is grounded. According to whether the first bit (bit 1) or second bit (bit 2) is being programmed, a voltage +Vsdpgm (i.e., a positive-potential predetermined source/drain junction voltage for programming) is applied to the source/drain junction of the bit being programmed and the Vsd(1 or 2) layer, while the other source/drain junction, (i.e., that of the "non-programmed" bit), is grounded. Specifically, as shown in FIG. 4, to selectively program the first bit, +Vsdpgm is applied to the Vsd1 layer and the Vsd2 layer is grounded. Similarly, as shown in FIG. 5, to selectively program the second bit, +Vsdpgm is applied to the Vsd2 layer and the Vsd1 layer is grounded. Under these biasing conditions, electrons are transmitted via source-to-channel injection to the source/drain junction of the bit being programmed. The transmitted electrons change from channel electrons to hot electrons upon nearing the source/drain junction of the bit being programmed. The accumulation of hot electrons generates a vertical electric field. That is, in the example of FIG. 4, the injected electrons travel from the Vsd2 layer to the Vsd1 layer to program the first bit. The electrons change to hot electrons as they move toward the Vsd1 layer (see FIG. 4). In the example of FIG. 5, the injected electrons travel from the Vsd1 layer to the Vsd2 layer to program the second bit. The electrons change to hot electrons as they move toward the Vsd2 layer (see FIG. 5). Programming of the selected bit occurs when the potential well of the corresponding bit charge storage unit 33 or 34 is charged with the hot electrons as a result of the vertical electric field generated after the source-to-channel injection.

FIG. 6 specifically illustrates an example block-unit or page-unit erasing procedure performed in accordance with the teachings of the present invention. In the illustrated example, a voltage–Vgers (i.e., a negative-potential predetermined gate voltage for erasing), is applied to the main gate electrode 35 while the semiconductor substrate 31 is grounded or floated. A predetermined erasing bias condition is achieved by applying the above voltage potentials to the main gate electrode 35 and the semiconductor substrate 31, and by either grounding each of the Vsd1 and Vsd2 layers or respectively applying a voltage +Vsders, (i.e., a positive-potential predetermined source/drain junction voltage for erasing) to each of the Vsd1 and Vsd2 layers. Under this biasing condition, cell erasing occurs when electrons stored in the potential well layers 33b and 34b of the first and second bit charge storage units 33 and 34 are Fowler-Nordheim-tunneled, to be respectively delivered to the Vsd1 and Vsd2 layers. Alternatively, the erase bias condition may cause the electrons to undergo a hot-hole injection (HHI) process, from the Vsd1 and Vsd2 layers to the potential well layers 33b and 34b, respectively, whereby hot holes are combined with electrons stored in the potential well layers, such that the charge of each potential well is removed by way of band-to-band (BTB) tunneling or electron-hole pair (EHP) generation.

Though not specifically shown in the drawings, a bit-unit erasing can be achieved by applying voltage potentials as described above to the main gate electrode 35 and the semiconductor substrate 31 (i.e., –Vgers to the main gate electrode while grounding or floating the semiconductor substrate 31), while applying an erasing bias in the form of +Vsders or ground potential (GND) to the source/drain junction of the bit to be erased, and floating the other ("non-erased") source/drain junction. For example, in selectively erasing either the first or second bit, in addition to applying –Vgers to the main gate electrode 35 while grounding or floating the semiconductor substrate 31, the first bit can be erased by applying +Vsders or GND to the Vsd1 layer and floating the Vsd2 layer, and/or the second bit can be erased by applying +Vsders or GND to the Vsd2 layer and floating the Vsd1 layer.

FIGS. 7 and 8 each illustrate an example method for reading data stored in a cell of the example non-volatile memory device. The method first detects whether the cell is in a programmed state or an erased state. To read data from, for example, the first bit of the cell, a voltage +Vgref (i.e., a positive-potential predetermined gate reference voltage) is applied to the main gate electrode 35 while the semiconductor substrate 31 and the Vsd1 layer (the source/drain junction of the bit being read) are grounded, and a voltage +Vsdr(i.e., a positive-potential predetermined source/drain junction voltage for reading) is applied to the Vsd2 layer (the other "non-read" source/drain junction). Under the above read bias condition, the resulting operation of the example non-volatile memory device differs depending on whether the bit (bit 1) of the cell is in an erased state as in FIG. 7 or is in a programmed state as in FIG. 8. The bias voltage applied to the respective source/drain junctions generates a localized potential in a channel region, enabling detection of programmed/erased state of the corresponding bit.

That is, as shown in FIG. 7, if the first bit of the cell is in a programmed state, the electron charge of the potential well layer 33b locally increases a potential of a channel region of the semiconductor substrate 31 (i.e., a portion of the semiconductor substrate situated directly below the first-bit potential well layer), and creates a potential barrier of 0.8~1.0 eV, which blocks the source-to-channel injection of electrons from the Vsd1 layer to the channel region (no current flow). The programmed state of the first bit is thus determined based on the absence of a current flow into the channel region, enabling the data stored in the first bit to be read. Conversely, as shown in FIG. 8, if the first bit of the cell is in an erased state, there is no electron charge present in the potential well layer 33b, such that no potential barrier is created, thereby allowing the source-to-channel injection of electrons from the Vsd1 layer to the channel region to occur (current flow). The erased state of the first bit is thus determined based on the presence of a current flow into the channel region.

As shown in FIGS. 7 and 8, the potential of the channel region as determined by the biasing of the Vsd2 layer enables an accurate detection of the programmed/erased state of the first bit regardless of whether the first bit is over-erased, thereby enabling an accurate reading of programmed bits. In other words, although the bit of a cell may be in an over-erased state, the over-erasing of the bit does not lead to further problems, and, even if a cell's threshold voltage is below 0V due to an instance of over-erasing, data can still be accurately read. Thus, in the illustrated example, the main gate electrode 35 acts as a selection gate as well as a control gate, which enables the proper operation of a non-volatile memory device, even with a negative threshold voltage, thereby effectively extending the threshold voltage window.

FIG. 9 also illustrates an example method for reading data stored in a cell of the non-volatile memory device. Specifically, FIG. 9 illustrates an example cell in which both the first and second bits are programmed and one of the bits is to be read. In the example of FIG. 9, the second bit is being read. In the illustrated example, analogous to the method shown in FIGS. 7 and 8, the read bias condition is achieved by applying +Vgref to the main gate electrode 35 while grounding the semiconductor substrate 31 and the source/drain junction of the bit being read (i.e., the Vsd2 layer) and by applying +Vsdr to the other source/drain junction (the Vsd1 layer). In this case, with the Vsd1 layer receiving a positive voltage with respect to the Vsd2 layer, the Vsd1 layer acts as a drain and the Vsd2 layer acts as a source.

Accordingly, the electron charge of the potential well layer 34b locally increases the potential of the channel region under the second-bit potential well layer and creates a potential barrier blocking the source-to-channel injection of electrons from the Vsd2 layer to the channel region, enabling the data stored in the second bit to be read. This process is analogous to the method shown in FIGS. 7 and 8. In this case, however, the resulting potential of the channel region under the first-bit potential well layer 33b (i.e., the "non-read" bit) and channel region current flow status, as determined by the bias voltage applied to the Vsd1 layer, is unaffected by the electron charge of the potential well layer, thereby allowing a normal read operation of the second bit to be carried out.

By adopting the above-described example non-volatile memory device and method for driving the same, several advantageous effects result. For example, a non-volatile memory device that exhibits no over-erasing problems is realized. The effective suppression of over-erasing problems results in many benefits, including: (a) reduced test time (since there is no need for over-erased cell detection), (b) obviation of the need for a circuit for increasing a threshold voltage of an over-erased cell, (c) simplification of the erasing operation, and (d) an extended threshold voltage window. Meanwhile, the main gate electrode 35 of the example non-volatile memory device described above simultaneously performs the function of a selection gate, which obviates the need for constructing a selection gate and enables the realization of a non-volatile memory device exhibiting no drain turn-on problems. This permits device operation using a lower program voltage, an effectively reduced number of charge pumping circuits, and an enhancement of endurance characteristics associated with drain disturbance. Since there is no need for constructing a selection gate or a circuit for increasing a threshold voltage of an over-erased cell, and since fewer charge pumping circuits are needed, the manufacture of the device is simplified and device integration is facilitated.

Moreover, the localized transfer of electrons with respect to the bit charge storage units, namely, a localized charge amplifying effect of the potential well of either of the potential well layers, enables faster programming speeds for the implementation of a high-performance non-volatile memory device. Charge loss due to a coupling with respect to neighboring elements within a single-transistor stacked cell structure is also prevented, since the potential well layer is formed of an oxide layer or a nitride layer and is, therefore, unaffected by coupling to a neighboring element. Since charge loss is thus prevented, enhanced device scalability can be provided.

Importantly, the above described example methods and apparatus enable manufacture of a two-bit device using only one transistor, such that integration is markedly increased and production cost per bit is reduced.

From the foregoing, persons of ordinary skill in the art will appreciate that non-volatile memory devices that solve an over-erasing problem without a separate test for detecting an over-erased cell and without circuitry for increasing the threshold voltage of an over-erased cell have been disclosed.

Persons of ordinary skill in the art will further appreciate that non-volatile memory devices which effectively extend a threshold voltage window have been disclosed.

Persons of ordinary skill in the art will further appreciate that non-volatile memory devices which require no additional area for coping with an over-erasing state, thereby enhancing device integration, have been provided.

Persons of ordinary skill in the art will also appreciate that non-volatile memory devices which require reduced test time have also been disclosed.

Persons of ordinary skill in the art will further appreciate that non-volatile memory devices which simplify the erasing operation have been disclosed.

Persons of ordinary skill in the art will also appreciate that non-volatile memory devices having a main gate electrode that simultaneously performs the function of a selection gate have been disclosed.

Persons of ordinary skill in the art will further appreciate that non-volatile memory devices which obviate the need for constructing a selection gate have also been provided.

Persons of ordinary skill in the art will further appreciate that non-volatile memory devices exhibiting no drain turn-on problems, which permits device operation using a lower program voltage, an effectively reduced number of charge pumping circuits, and an enhancement of endurance characteristics associated with drain disturbance have been disclosed.

Moreover, persons of ordinary skill in the art will further appreciate that non-volatile memory devices have been disclosed in which the manufacture of the device is simplified and device integration is facilitated.

Furthermore, persons of ordinary skill in the art will also appreciate that non-volatile memory devices which enable faster programming speeds for the implementation of a high-performance non-volatile memory device have been disclosed.

In addition, persons of ordinary skill in the art will appreciate that non-volatile memory devices which prevent charge loss due to a coupling with respect to neighboring elements within a single-transistor stacked cell structure and thus provides enhanced device scalability have been disclosed.

Persons of ordinary skill in the art will further appreciate that non-volatile memory devices which enable manufacture of a two-bit device using only one transistor, such that integration is markedly increased and production cost per bit is reduced have been provided herein.

Persons of ordinary skill in the art will additionally appreciate that methods for driving any of the above non-volatile memory devices have been disclosed.

A disclosed example non-volatile memory device comprises a semiconductor substrate; source/drain junctions formed in a predetermined surface region of the semiconductor substrate; a main gate oxide layer formed on a surface of the semiconductor substrate and disposed between the source/drain junctions, a first end of the main gate oxide layer comprising a first bit charge storage unit including a first tunnel oxide layer, a first potential well layer, and a first coupling oxide layer and a second, opposing end of the main gate oxide layer comprising a second bit charge storage unit including a second tunnel oxide layer, a second potential well layer, and a second coupling oxide layer; and a main gate electrode above the main gate oxide layer.

A disclosed example method for driving the above non-volatile memory device comprises: programming the non-volatile memory device by creating a predetermined program bias condition to cause delivery of channel electrons from a source junction to a drain junction and a production of hot electrons as the channel electrons near the drain junction, thereby forming a vertical electric field at the drain junction to inject electrons into at least one of the first and second potential well layers.

A disclosed example method for driving the above non-volatile memory device comprises: erasing stored bits from at least one of the first and second bit charge storage units. The erasing operation is achieved by creating a predetermined erasing bias condition to cause either a Fowler-Nordheim tunneling of electrons stored in the first and second potential well layers, whereby the electrons are delivered to the source/drain junctions, or an injection of hot holes of the source/drain junctions into the first and second potential well layers, whereby the hot holes are combined with electrons stored in the first and second potential well layers.

A disclosed example method for driving the above non-volatile memory device comprises: reading one of the first and second bit charge storage units to determine one of an erased state and a programmed state by creating a predetermined read bias condition, the erased state being determined if there is a current flow between the source/drain junctions and the programmed state being determined if there is no current flow between the source/drain junctions.

It is noted that this patent claims priority from Korean Patent Application Serial Number 10-2004-0042120, which was filed on Jun. 9, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A non-volatile memory device, comprising:
a semiconductor substrate;
source/drain junctions in a predetermined region of the semiconductor substrate;
a main gate oxide layer above the semiconductor substrate and disposed between the source/drain junctions, a first end of the main gate oxide layer comprising a first bit charge storage unit including: (a) a first tunnel oxide layer, (b) a first potential well layer, and (c) a first coupling oxide layer, and a second end of the main gate oxide layer comprising a second bit charge storage unit including (a) a second tunnel oxide layer, (b) a second potential well layer, and (c) a second coupling oxide layer; and
a main gate electrode above the main gate oxide layer.

2. A non-volatile memory device as defined in claim 1, wherein the first and second tunnel oxide layers are disposed adjacent the semiconductor substrate and wherein the first and second coupling oxide layers are disposed adjacent the main gate electrode.

3. A non-volatile memory device as defined in claim 1, wherein the first tunnel oxide layer, the first potential well layer, and the first coupling oxide layer of the first bit charge storage unit are sequentially stacked and disposed between the semiconductor substrate and the main gate electrode, and wherein the second tunnel oxide layer, the second potential well layer, and the second coupling oxide layer of the second bit charge storage unit are sequentially stacked and disposed between the semiconductor substrate and the main gate electrode.

4. A non-volatile memory device as defined in claim 1, wherein the first bit charge storage unit permits a first controllable flow of electrons between the main gate electrode and the semiconductor substrate, and wherein the second bit charge storage unit permits a second controllable flow of electrons between the main gate electrode and the semiconductor substrate.

5. A non-volatile memory device as defined in claim 1, wherein the first potential well layer is formed of a material having an energy band gap less than (a) an energy band gap of the first tunnel oxide layer and (b) an energy band gap of the first coupling oxide layer, and wherein the second potential well layer is formed of a material having an energy band gap less than (a) an energy band gap of the second tunnel oxide layer and (b) an energy band gap of the second coupling oxide layer.

6. A non-volatile memory device as defined in claim 1, wherein each of the first and second potential well layers are formed of a material having an energy band gap less than (a) an energy band gap of the first tunnel oxide layer, (b) an energy band gap of the second tunnel oxide layer, (c) an energy band gap of the first coupling oxide layer, and (d) an energy band gap of the second coupling oxide layer.

7. A non-volatile memory device as defined in claim 1, wherein the first potential well layer is formed of a material having a dielectric constant higher than (a) a dielectric constant of the first tunnel oxide layer and (b) a dielectric constant of the first coupling oxide layer, and wherein the second potential well layer is formed of a material having a dielectric constant higher than (a) a dielectric constant of the second tunnel oxide layer and (b) a dielectric constant of the second coupling oxide layer.

8. A non-volatile memory device as defined in claim 1, wherein the first potential well layer is formed of a material having a trap density lower than (a) a trap density of the first tunnel oxide layer and (b) a trap density of the first coupling oxide layer, and wherein the second potential well layer is formed of a material having a trap density lower than (a) a trap density of the second tunnel oxide layer and (b) a trap density of the second coupling oxide layer.

9. A non-volatile memory device as defined in claim 1, wherein the first potential well layer is formed of a material having: (a) a dielectric constant higher than (1) a dielectric constant of the first tunnel oxide layer and (2) a dielectric constant of the first coupling oxide layer, and (b) a trap density lower than (1) a trap density of the first tunnel oxide layer and (2) a trap density of the first coupling oxide layer, and wherein the second potential well layer is formed of a material having: (a) a dielectric constant higher than (1) a dielectric constant of the second tunnel oxide layer and (2) a dielectric constant the second coupling oxide layer, and (b) a trap density lower than (1) a trap density of the second tunnel oxide layer and (2) a trap density of the second coupling oxide layer.

10. A non-volatile memory device as defined in claim 1, wherein each of the first and second potential well layers are formed of a material having: (1) a dielectric constant higher than (a) a dielectric constant of the first tunnel oxide layer, (b) a dielectric constant of the second tunnel oxide layer, (c) a dielectric constant of the first coupling oxide layer, and (d) a dielectric constant of the second coupling oxide layer, and (2) a trap density lower than (a) a trap density of the first tunnel oxide layer, (b) a trap density of the second tunnel oxide layer, (c) a trap density of the first coupling oxide layer, and (d) a trap density of the second coupling oxide layer.

11. A non-volatile memory device as defined in claim 1, wherein each of the first and second tunnel oxide layers and the first and second coupling oxide layers are formed of one selected from the group consisting of $SiO_2$, $Al_2O_3$, and $Y_2O_3$.

12. A non-volatile memory device as defined in claim 1, wherein each of the first and second potential layers are formed of one selected from the group consisting of $HfO_2$, $ZrO_2$, $BaZrO_2$, $BaTiO_2$, $Ta_2O_5$, $ZrSiO_4$, a lanthanide-based oxide layer, and a nitride layer.

13. A method for driving a non-volatile memory device as defined in claim 1, the method comprising:
programming the non-volatile memory device by creating a predetermined program bias condition to cause a delivery of channel electrons from the source junction to the drain junction and a production of hot electrons as the channel electrons near the drain junction, thereby forming a vertical electric field at the drain junction to inject electrons into at least one of the first and second potential well layers.

14. A method as defined in claim 13, wherein the predetermined program bias condition is a condition where a predetermined positive voltage is applied to each of the main gate electrode and the drain junction, and wherein each of the source junction and the semiconductor substrate are grounded.

15. A method for driving a non-volatile memory device as defined in claim 1, the method comprising:
erasing stored bits from at least one of the first or second bit charge storage units by creating a predetermined erasing bias condition to cause a Fowler-Nordheim tunneling of electrons stored in the first or second potential well layers, whereby the electrons are delivered to the source/drain junctions.

16. A method as defined in claim 15, wherein, when the erasing erases the stored bits from each of the first and second bit charge storage units simultaneously, the predetermined erasing bias condition is a condition wherein a predetermined negative voltage is applied to the main gate electrode and wherein each of the semiconductor substrate and the source/drain junctions are grounded.

17. A method as defined in claim 15, wherein, when the erasing erases the stored bits from each of the first and second bit charge storage units simultaneously, the predetermined erasing bias condition is a condition wherein a predetermined negative voltage is applied to the main gate electrode, wherein the semiconductor substrate is grounded, and wherein a predetermined positive voltage is applied to the source/drain junctions.

18. A method as defined in claim 15, wherein, when the erasing erases the stored bits from each of the first and second bit charge storage units simultaneously, the predetermined erasing bias condition is a condition wherein a predetermined negative voltage is applied to the main gate electrode, wherein the semiconductor substrate is floated, and wherein a predetermined positive voltage is applied to the source/drain junctions.

19. A method as defined in claim 15, wherein, when the erasing erases the stored bits from only one of the first or second bit charge storage units, the predetermined erasing bias condition is a condition wherein a predetermined negative voltage is applied to the main gate electrode, wherein the semiconductor substrate is grounded, wherein a predetermined positive voltage is applied to the source/drain junction of the one of the first or second bit charge storage units being erased, and wherein the source/drain junction of the other one of the first or second bit charge storage units is grounded.

20. A method as defined in claim 15, wherein, when the erasing erases the stored bits from only one of the first or second bit charge storage units, the predetermined erasing bias condition is a condition wherein a predetermined negative voltage is applied to the main gate electrode, wherein the semiconductor substrate is floated, wherein a predetermined positive voltage is applied to the source/drain junction of the one of the first or second bit charge storage units being erased, and wherein the source/drain junction of the other one of the first or second bit charge storage units is grounded.

21. A method as defined in claim 15, wherein, when the erasing erases the stored bits from only one of the first or second bit charge storage units, the predetermined erasing bias condition is a condition wherein a predetermined negative voltage is applied to the main gate electrode, wherein the semiconductor substrate and the source/drain junction of the one of the first or second bit charge storage units being erased are grounded, and wherein the source/drain junction of the other one of the first or second bit charge storage units is floated.

22. A method as defined in claim 15, wherein, when the erasing erases the stored bits from only one of the first or second bit charge storage units, the predetermined erasing bias condition is a condition wherein a predetermined negative voltage is applied to the main gate electrode, wherein the semiconductor substrate is floated, wherein the source/drain junction of the one of the first or second bit charge storage units being erased is grounded, and wherein the source/drain junction of the other one of the first or second bit charge storage units is floated.

23. A method for driving a non-volatile memory device as defined in claim 1, the method comprising:
erasing stored bits from at least one of the first or second bit charge storage units by creating a predetermined erasing bias condition to cause an injection of hot holes of the source/drain junctions into the first or second potential well layers, whereby the hot holes are combined with electrons stored in the first or second potential well layers.

24. A method as defined in claim 23, wherein, when the erasing erases the stored bits from each of the first and second bit charge storage units simultaneously, the predetermined erasing bias condition is a condition wherein a predetermined negative voltage is applied to the main gate electrode and wherein each of the semiconductor substrate and the source/drain junctions are grounded.

25. A method as defined in claim 23, wherein, when the erasing erases the stored bits from each of the first and second bit charge storage units simultaneously, the predetermined erasing bias condition is a condition wherein a predetermined negative voltage is applied to the main gate electrode, wherein the semiconductor substrate is grounded, and wherein a predetermined positive voltage is applied to the source/drain junctions.

26. A method as defined in claim 23, wherein, when the erasing erases the stored bits from each of the first and second bit charge storage units simultaneously, the predetermined erasing bias condition is a condition wherein a predetermined negative voltage is applied to the main gate electrode, wherein the semiconductor substrate is floated, and wherein a predetermined positive voltage is applied to the source/drain junctions.

27. A method as defined in claim 23, wherein, when the erasing erases the stored bits from only one of the first or second bit charge storage units, the predetermined erasing bias condition is a condition wherein a predetermined negative voltage is applied to the main gate electrode, wherein the semiconductor substrate is grounded, wherein a predetermined positive voltage is applied to the source/drain junction of the one of the first or second bit charge storage units being erased, and wherein the source/drain junction of the other one of the first or second bit charge storage units is floated.

28. A method as defined in claim 23, wherein, when the erasing erases the stored bits from only one of the first or second bit charge storage units, the predetermined erasing bias condition is a condition wherein a predetermined negative voltage is applied to the main gate electrode, wherein the semiconductor substrate is floated, wherein a predetermined positive voltage is applied to the source/drain junction of the one of the first or second bit charge storage units being erased, and wherein the source/drain junction of the other one of the first or second bit charge storage units is floated.

29. A method as defined in claim 23, wherein, when the erasing erases the stored bits from only one of the first or second bit charge storage units, the predetermined erasing bias condition is a condition wherein a predetermined negative voltage is applied to the main gate electrode, wherein the semiconductor substrate and the source/drain junction of the one of the first and second bit charge storage units being erased are grounded, and wherein the source/drain junction of the other one of the first or second bit charge storage units is floated.

30. A method as defined in claim 23, wherein, when the erasing erases the stored bits from only one of the first or second bit charge storage units, the predetermined erasing bias condition is a condition wherein a predetermined negative voltage is applied to the main gate electrode, wherein the semiconductor substrate is floated, wherein the source/drain junction of the one of the first or second bit charge storage units being erased is grounded, and wherein the source/drain junction of the other one of the first or second bit charge storage units is floated.

31. A method for driving a non-volatile memory device as defined in claim 1, the method comprising:

reading the first or second bit charge storage units to determine an erased stated or a programmed state by creating a predetermined read bias condition, the erased state being determined if there is a current flow between the source/drain junctions and the programmed state being determined if there is no current flow between the source/drain junctions.

32. A method as defined in claim 31, wherein the predetermined read bias condition is a condition wherein each of the semiconductor substrate and the source/drain junction of the one of the first or second bit charge storage units being read are grounded and wherein a predetermined positive voltage is applied to each of the main gate electrode and the source/drain junction of the other one of the first or second bit charge storage units.

33. A method as defined in claim 32, wherein, if an erased state of one of the first or second bit charge storage units is determined, the erased state is recognized by a current flow between the source/drain junctions and a semiconductor substrate potential for a portion of the semiconductor substrate situated directly below the bit charge storage unit being read, the current flow resulting from the predetermined positive voltage being applied to the main gate electrode and the semiconductor substrate potential resulting from the predetermined positive voltage being applied to the source/drain junction of the other one of the first or second bit charge storage units.

* * * * *